(12) United States Patent
Scolari et al.

(10) Patent No.: US 11,025,232 B2
(45) Date of Patent: Jun. 1, 2021

(54) ELECTRONIC DEVICE

(71) Applicant: CSEM Centre Suisse d'Electronique et de Microtechnique SA—Recherche et Developpement, Neuchatel (CH)

(72) Inventors: Nicola Scolari, Lausanne (CH); Marc Pon Sole, Neuchatel (CH); David Ruffieux, Les Agettes (CH)

(73) Assignee: CSEM CENTRE SUISSE D'ELECTRONIQUE ET DE MICROTECHNIQUE SA—RECHERCHE ET DÉVELOPPEMENT, Neuchâtel (CH)

( * ) Notice: Subject to any disclaimer, the term of this patent is extended or adjusted under 35 U.S.C. 154(b) by 0 days.

(21) Appl. No.: 16/964,320

(22) PCT Filed: Jan. 25, 2018

(86) PCT No.: PCT/IB2018/050463
§ 371 (c)(1),
(2) Date: Jul. 23, 2020

(87) PCT Pub. No.: WO2019/145753
PCT Pub. Date: Aug. 1, 2019

(65) Prior Publication Data
US 2020/0350893 A1 Nov. 5, 2020

(51) Int. Cl.
*H03K 3/011* (2006.01)
*H02M 3/07* (2006.01)
(Continued)

(52) U.S. Cl.
CPC ............. *H03K 3/011* (2013.01); *H02M 3/07* (2013.01); *H03K 3/012* (2013.01); *H03K 3/0315* (2013.01); *H03L 7/0995* (2013.01)

(58) Field of Classification Search
None
See application file for complete search history.

(56) References Cited

U.S. PATENT DOCUMENTS 6,466,077 B1 10/2002 Miyazaki et al.
9,860,639 B2 * 1/2018 Vinter .................... H04R 25/30
(Continued)

FOREIGN PATENT DOCUMENTS

EP 3187960 A1 7/2017

OTHER PUBLICATIONS

International Search Report for PCT/1132018/050463 dated Dec. 13, 2018.
(Continued)

*Primary Examiner* — Cassandra F Cox
(74) *Attorney, Agent, or Firm* — Pearne & Gordon LLP

(57) ABSTRACT

An electronic device including a digital circuit to be compensated and a compensation device for compensating PVT variations of this digital circuit. This compensation device is arranged also for controlling the operating speed of the digital circuit and can also be arranged for equalising a rise time and a fall time of a logic gate including the transistors of the digital circuit. The electronic device implements a first loop, allowing to control the operating speed of the digital circuit by exploiting the same voltage at the compensation terminals of the compensation device and at the terminals at the digital circuit and at a critical path replica module allowing to control the threshold voltages of the respective transistors. The electronic device can implement also a second loop allowing to equalise the rise and fall times of a logic gate including the transistors of the digital circuit.

19 Claims, 8 Drawing Sheets

(51) Int. Cl.
    *H03K 3/012*     (2006.01)
    *H03K 3/03*     (2006.01)
    *H03L 7/099*     (2006.01)

(56) References Cited

U.S. PATENT DOCUMENTS

| 2004/0135621 | A1 | 7/2004 | Sumita et al. |
| 2004/0183588 | A1 | 9/2004 | Chandrakasan et al. |
| 2008/0136400 | A1 | 6/2008 | Chi et al. |
| 2011/0095811 | A1 | 4/2011 | Chi et al. |

OTHER PUBLICATIONS

Written Opinion for PCT/IB2018/050463 dated Dec. 13, 2018.
International Preliminary Report on Patentability for PCT/IB2018/050463 dated Apr. 22, 2020.
Zaliasl, S. et al., "A 3 ppm 1.5 × 0.8 mm2 1.0 μA 32.768 kHz MEMS-Based Oscillator", IEEE Journal of Solid-State Circuits, Jan. 2015, pp. 291-302, vol. 50, No. 1.
Vittoz, Eric A., et al., "High-Performance Crystal Oscillator Circuits: Theory and Application", IEEE Journal of Solid-State Circuits, Jun. 1988, pp. 774-783, vol. 23, No. 3.

\* cited by examiner

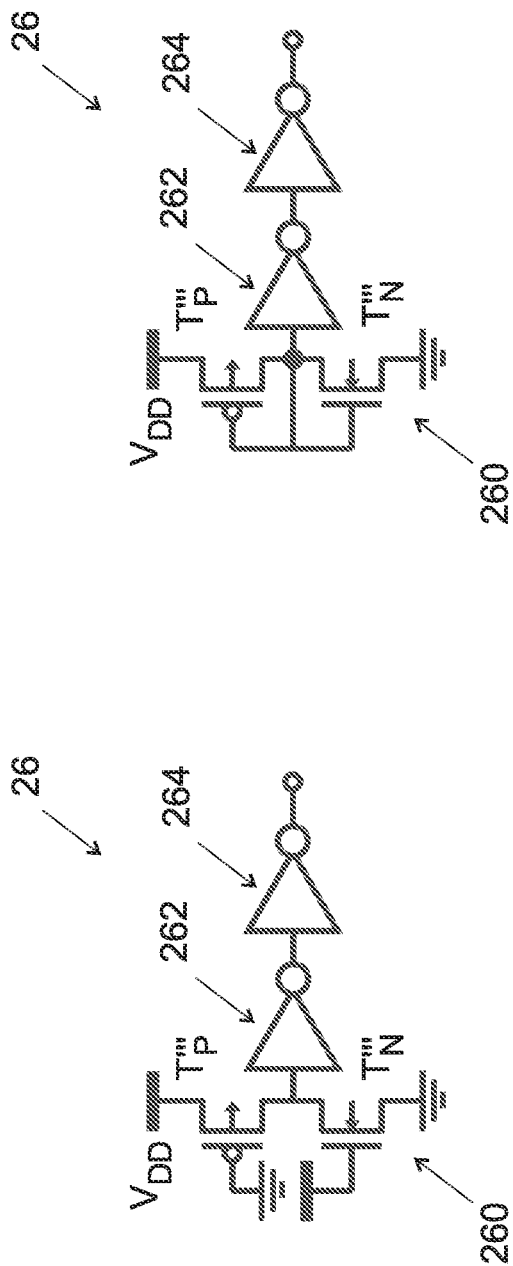
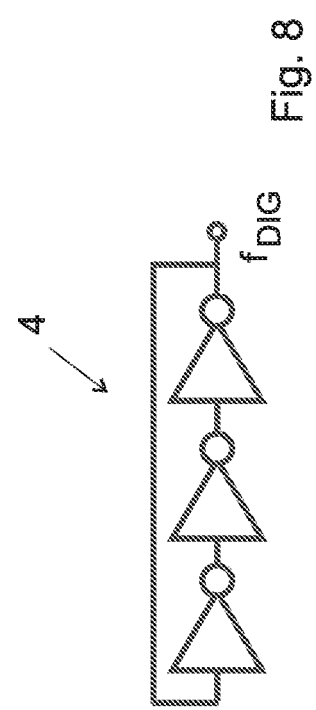
Fig. 7A  Fig. 7B  Fig. 8

ELECTRONIC DEVICE

FIELD OF THE INVENTION

The present invention concerns an electronic device. In particular, the present invention concerns an electronic device comprising a digital circuit to be compensated and a compensation device for compensating PVT variations of this digital circuit. This compensation device is arranged also for controlling the operating speed of the digital circuit. This compensation device can also be arranged for equalising a rise time and a fall time of a logic gate comprising the transistors of the digital circuit. This electronic device allows robust low voltage operation of digital circuits.

DESCRIPTION OF RELATED ART

With the constant scaling of MOS transistors resulting in ever increasing speed performance, it has long been proposed to supply analog and/or digital circuits (e.g. and in a non-limiting way, digital gates) at lower voltages, so to spare dynamic power (equal to $f \cdot C \cdot V^2$, where f is the clock frequency, C the gate capacitance being switched and V the supply voltage of the circuit), as long as required speed performance can be met.

Provided the transistors are operated in strong inversion or in the super-$V_{Th}$ region (i.e. their gate-source voltage is higher than the threshold voltage of the transistor, i.e. $|V_{GS}| \gg V_{Th}$), the variation in speed performance of the analog and/or digital circuit over Process-Voltage-Temperature variations ("PVT variations" in the following) remains reasonable, permitting the generation of the lower reference voltage, e.g. by using a bandgap circuit or a similar circuit, providing a mostly PVT-insensitive constant voltage output. In such a way, it is possible to guarantee a controlled dynamic power dissipation.

For example, a 180 nm CMOS node having a nominal core voltage $V_{DD}$ of 1.8 V, a threshold voltage $V_{Th}$ of 450 mV, operation at $V_{DD}$ from 0.8 V to 1 V permits an about 4-fold power reduction.

However, more advanced process nodes face a constant nominal voltage reduction (e.g. 1 V-1.2 V for a 55-65 nm CMOS) imposed by thinner gate oxide, calling for more drastic voltage reduction if significant energy savings are desired. As the threshold voltage $V_{Th}$ of the transistors does not scale as fast as nominal voltage, the transistors of the analog and/or digital circuits are operated more and more in the near-threshold region or in the sub-threshold region, exacerbating their sensitivity to PVT variations.

In this context, the expression "sub-threshold region" indicates that the gate-source voltage of the transistor is lower than the threshold voltage of the transistor, i.e. $|V_{GS}| < V_{Th}$.

In this context, the expression "near-threshold region" indicates that the gate-source voltage of the transistor is at or near the threshold voltage of the transistor, i.e. $|V_{GS}| \approx V_{Th}$. In other words, the difference between the gate-source voltage of the transistor and its threshold voltage is of some tenths of Volts at most.

In near-threshold regions or in a sub-threshold regions, the bandgap-based constant voltage approach, used in super-$V_{th}$ regions, reaches its limits, calling for PVT-variations tracking adaptive reference generation devices.

Ways to control the power dissipation of logic gates were proposed for watch circuits, for a nominal voltage $V_{DD}$ of 5 V and for threshold voltage $V_{Th}$ of about 2 V. a particular way is described in the document E. Vittoz et. al., "*High-Performance Crystal Oscillator Circuits: Theory and Application*", IEEE, J. Solid State Circuits, Vol. 23, no. 3, pp. 774-783, June 1998. The main drawback of this solution is that the dynamic power dissipated by the logic gates compensated by such a device will vary significantly.

Another known compensation device, generating a lower voltage, is described in the document S. Z Asl, et. al., "*A 3 ppm 1.5×0.8 $mm^2$ 1.0 µA 32.768 kHz MEMS-Based Oscillator*", J. Solid-State Circuits, Vol. 50, no. 1, pp. 1-12, Jan. 2015. Although the dynamic power dissipated by the logic gates compensated by such a device varies less than the previous solution, logic gates compensated by such a device will have their slowest transistor (NMOS or PMOS) delivering an ION current similar to the biasing one I, guarantying a minimum circuit speed. The speed of the other transistor type (PMOS or NMOS) will depend on the specific process corner, being maximal in slow-fast (SF) or fast-low (FS) cases, and rather close in typical-typical (TT), fast-fast (FF) or slow-slow (SS) ones. Under low voltage operation, in the case the transistors are operated in the sub- or near-threshold region, this can result in huge N to P type MOS current ratios, leading to large leakage currents or even compromising retention in SRAM cells of the circuit to be compensated.

In this context, the expression "low voltage operation" for a circuit indicates that the difference between the voltage of a first supply source and the voltage of a second supply source of the circuit is comprised between 50 mV and 900 mV, preferably being substantially equal to 500 mV.

The document US20040135621 concerns a semiconductor integrated circuit apparatus capable of controlling the substrate voltage of a MOSFET so that the drain current for an arbitrary gate voltage value in a subthreshold region or a saturated region will be free from temperature dependence and process variation dependence. The semiconductor integrated circuit apparatus includes:

an integrated circuit main body having a plurality of MOSFETs on a semiconductor substrate, a circuit generating a constant threshold voltage $V_{Th}$ or a constant current flowing in the transistors ($I_{DS}$).

This circuit generating a constant threshold voltage $V_{Th}$ or a constant current $I_{DS}$ comprises monitoring means (a constant current source and a monitoring MOSFET formed on the same substrate as the plurality of MOSFETs of the integrated circuit main body) and comparison means (e.g. an operational amplifier).

The output of the comparison means is connected to the bulk of the monitoring MOSFET, so as to compensate PVT variations.

The described compensation device does not allow to control the operating speed of the digital circuit to be compensated. The described compensation device does not allow also to equalise a rise time and a fall time of a logic gate comprising the transistors of the digital circuit to be compensated.

In this context, the expression "operating speed" of the digital circuit to be compensated indicates a parameter of the digital circuit indicating how slow or fast the digital circuit works. In one embodiment, the operating speed of the digital circuit is its operating frequency.

In this context, the expression "rise time" indicates the time (or a percentage of the time) necessary for an output terminal of a logic gate of the digital circuit to be compensated, to go from a low voltage (corresponding to a logic zero value) to a high voltage (corresponding to a logic one value).

In this context, the expression "fall time" indicates the time (or a percentage of the time) necessary for an output terminal of a logic gate of the digital circuit to be compensated, to go from a high voltage (corresponding to a logic one value) to a low voltage (corresponding to a logic zero value).

The ratio of the currents flowing in the transistors of opposite polarity of the digital circuit to be compensated determines the ratio of the rise/fall times. In other words, by balancing those currents it is possible to equalise the rise time with the fall time.

Therefore, it is an aim of the present invention to propose an electronic device comprising a digital circuit to be compensated and a compensation device in which the aforementioned disadvantages are obviated or mitigated.

It is an aim of the present invention to propose an electronic device comprising a digital circuit to be compensated and a compensation device for compensating PVT variations of the digital circuit allowing also to control the operating speed of the digital circuit.

It is an aim of the present invention to propose an electronic device comprising a digital circuit to be compensated and a compensation device for compensating PVT variations of the digital circuit allowing also to equalise a rise time and a fall time of a logic gate comprising the transistors of the digital circuit.

It is an aim of the present invention to propose an electronic device comprising a digital circuit to be compensated and a compensation device for compensating PVT variations of the digital circuit in which the power dissipation is optimised.

It is an aim of the present invention to propose an electronic device comprising a digital circuit to be compensated and a compensation device compensating in an efficient way PVT variations of the digital circuit operating at low voltages.

It is an aim of the present invention to propose an electronic device comprising a digital circuit to be compensated and a compensation device compensating in an efficient way PVT variations of the digital circuit operating in the sub- or near-threshold region.

BRIEF SUMMARY OF THE INVENTION

According to the invention, these aims are achieved by means of an electronic device according to the appended claims.

BRIEF DESCRIPTION OF THE DRAWINGS

The invention will be better understood with the aid of the description of an embodiment given by way of example and illustrated by the figures, in which:

FIGS. 7A and 7B show a view of two embodiments of the current balance detector module which is present in one embodiment of the compensation device according to the invention.

FIG. 8 shows a view of one embodiment of the the critical path replica module of the compensation device according to the invention.

DETAILED DESCRIPTION OF POSSIBLE EMBODIMENTS OF THE INVENTION

Figure 1:
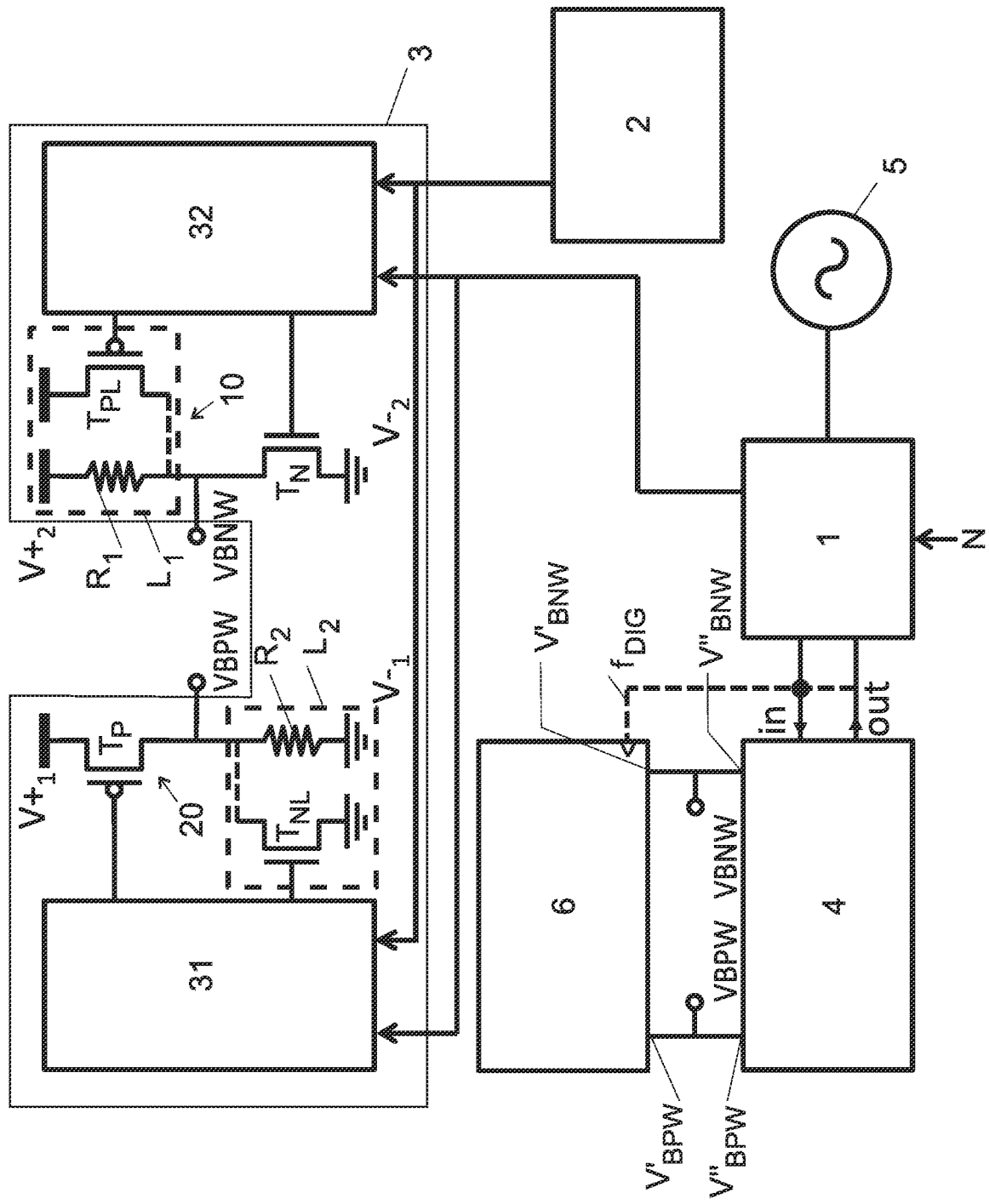
FIG. 1 shows a general view of the modules of an embodiment of the electronic device according to the invention.

FIG. 1 shows a general view of the modules of an embodiment of the electronic device 1000 according to the invention.

This the electronic device 1000 comprises:
- a digital circuit 6 to be compensated, arranged to be operated at an operating speed $f_{DIG}$, and
- a compensation device for compensating PVT variations of the digital circuit and for controlling this operating speed $f_{DIG}$, the compensation device comprising:
  - the reference or local oscillator 5,
  - the critical path replica module 4,
  - the speed or timing measurement module 1,
  - the first compensation terminal $V_{BPW}$,
  - the second compensation terminal $V_{BNW}$, and
  - the control module 3.

In the context of the present invention, the term "terminal" must be considered as a synonym of a node. It does not necessarily indicate that it is a pin that can be physically accessed by a user.

In the embodiment of FIG. 1, the compensation device comprises also the balance current detector module 2. However, its presence is not necessary for the working of the electronic device 1000 and will be discussed later.

The digital circuit 6 to be compensated comprises a first transistor and a second transistor of opposite polarity of the first transistor (e.g. the first transistor is a NMOS transistor and the second transistor is a PMOS transistor), which are not illustrated in FIG. 1. The digital circuit 6 comprises also a first terminal $V'_{BPW}$ and a second terminal $V'_{BNW}$ allowing to modify a threshold voltage of the first transistor respectively of the second transistor.

The digital circuit 6 to be compensated according to the invention comprises also a critical path module (not illustrated). The above-mentioned first and a second transistors belong to this critical path module. In one embodiment, the critical path module comprises a combination of cascades digital logic gates of standard library cells (e.g. inverters, NANDs, NORs, etc.), each of the logic gates comprising the first critical path replica transistor and/or the second critical path replica transistor. The critical path module generates a first delay $\tau'_D$. The critical path module is the path which has the longest delay between its input value and its output value. This longest delay or first delay $\tau'_D$ is related to the operating speed $f_{DIG}$.

In one preferred embodiment, the digital circuit 6 is arranged to be operated at low voltage. In this context the expression "low voltage" for a circuit indicates that the difference between the voltage of its first supply source and the voltage of its second supply source is comprised between 50 mV and 900 mV, preferably being substantially equal to 500 mV.

The oscillator 5 according to the invention is arranged to generate an oscillator signal having a predetermined frequency $f_{REF}$. In one embodiment, the oscillator is a crystal based oscillator (or XTAL oscillator). In one particular embodiment, it is arranged for generated a frequency of 32 kHz.

The critical path replica module 4 according to the invention is a replica of the critical path module of the digital circuit 6, i.e. it is arranged for generating a second delay $\tau_D$ equal or superior to a first delay of the critical path module of the digital circuit 6. In other words, $\tau_D \geq \tau'_D$.

The critical path replica module 4 comprises a first critical path replica transistor and a second critical path replica transistor of opposite polarity of the first critical path replica transistor (not illustrated). The first and second critical path replica transistors are a replica of the first respectively second transistors of the digital circuit 6.

In this context, the expression "being a replica" means that at least at a temporal instant, the four terminals (i.e. the source, gate, drain terminals and the terminal allowing to modify the threshold voltage of the transistor) of each of the transistors of the critical path replica module 4 are at the same potential of the corresponding terminals of the corresponding transistors of the critical path module of the digital circuit 6 to be compensated. Moreover, it also means that the transistors of the critical path replica module 4 are of the same technology of the corresponding transistors of the critical path module of the digital circuit 6. Finally, it also means that the transistors of the critical path replica module 4 match the corresponding transistors of the critical path module of the digital circuit 6, i.e. they have at least the same width to length ratio (W/L) and the same orientation on the silicon slice.

The critical path replica module 4 comprises also a first critical path replica terminal V"$_{BPW}$ and a second critical path replica terminal V"$_{BNW}$ allowing to modify a threshold voltage of the first respectively of the second critical path replica transistors.

As illustrated in FIG. 1, the first terminal V'$_{BPW}$ of the digital circuit 6 is arranged to be connected to the first critical path replica terminal V"$_{BPW}$, and the second terminal V'$_{BNW}$ of the digital circuit 6 is arranged to be connected to the second critical path replica terminal V"$_{BNW}$.

In the context of the present invention, the expression "connected to" means that the connection can be direct (i.e. without any element between the two connected parts), or that the two connected parts are linked by an electric path comprising in between one or more elements which do not modify the voltage between the connected parts (e.g. a buffer). The expression "connected to" could also mean that the two connected parts are linked by an electric path comprising in between one or more elements that could modify the voltage between the connected parts.

The speed measurement module 1 according to the invention is connected to the oscillator 5 and to the critical path replica module 4, in particular to its input "in" and its output "out".

In the embodiment illustrated in FIG. 1, the input of the critical path replica module 4 is the operating speed $f_{DIG}$ of the digital circuit 6 to be compensated. This feature is illustrated in FIG. 1 by a dotted line connecting the input "in" of the critical path replica module 4 and the digital circuit 6.

The speed measurement module 1 is arranged to determine a relation between the predetermined frequency of the oscillator $f_{REF}$ and the second delay $\tau_D$ of the critical path replica module 4.

The compensation device illustrated in FIG. 1 comprises a first compensation terminal V$_{BPW}$ arranged to be connected to the first terminal V'$_{BPW}$ of the digital circuit 6 and to the first critical path replica terminal V"$_{BPW}$ of the critical path replica module 4.

The compensation device illustrated in FIG. 1 comprises a second compensation terminal V$_{BNW}$ arranged to be connected to the second terminal V'$_{BNW}$ of the digital circuit 6 and to the second critical path replica terminal V"$_{BNW}$ of the critical path replica module 4.

In one preferred embodiment, the first and second terminals and the critical path replica terminals are bulk terminals or the back gate terminals of respective transistors. If those transistors comprise two gate terminals, the first and second terminals and the critical path replica terminals are the gate terminals of the respective transistors.

The control module 3 is arranged to be connected to the speed measurement module 2, to the first compensation terminal V$_{BPW}$ and to the second compensation terminal V$_{BNW}$, so as to adjust the voltage at the first compensation terminal V$_{BPW}$ and at the second compensation terminal V$_{BNW}$ (ant therefore the voltage at the the first and second terminals V'$_{BPW}$, V'$_{BNW}$ of the digital circuit 6 and the voltage at the the first and second critical path replica terminals V"$_{BPW}$, V"$_{BNW}$ of the critical path replica module 4) in order to modify the second delay $\tau_D$ of the critical path replica module 4, so as to operate the digital circuit 6 at the (desired) operating speed $f_{DIG}$.

In other words, the electronic device 1000 implements a first loop, allowing to control the operating speed $f_{DIG}$ of the digital circuit 6 by exploiting the same voltage at the terminals V$_{BPW}$, V'$_{BPW}$ and V"$_{BPW}$, respectively at the terminals V$_{BNW}$, V'$_{BNW}$ and V"$_{BNW}$.

In one preferred embodiment, this first loop comprises mainly and preferably only digital elements.

This first loop allows to implement the equation:

$$f_{DIG}=N^*f_{REF}$$

wherein $f_{DIG}$ is the operating speed, $f_{REF}$ is frequency generated by the oscillator and N is a positive fractional or integer number, preferably superior to one, which can be defined by the user of the electronic device according to the type of application of the electronic device (e.g. memories, processors, etc.) and/or the value of the operating speed and/or according to other user's needs.

Figure 4:
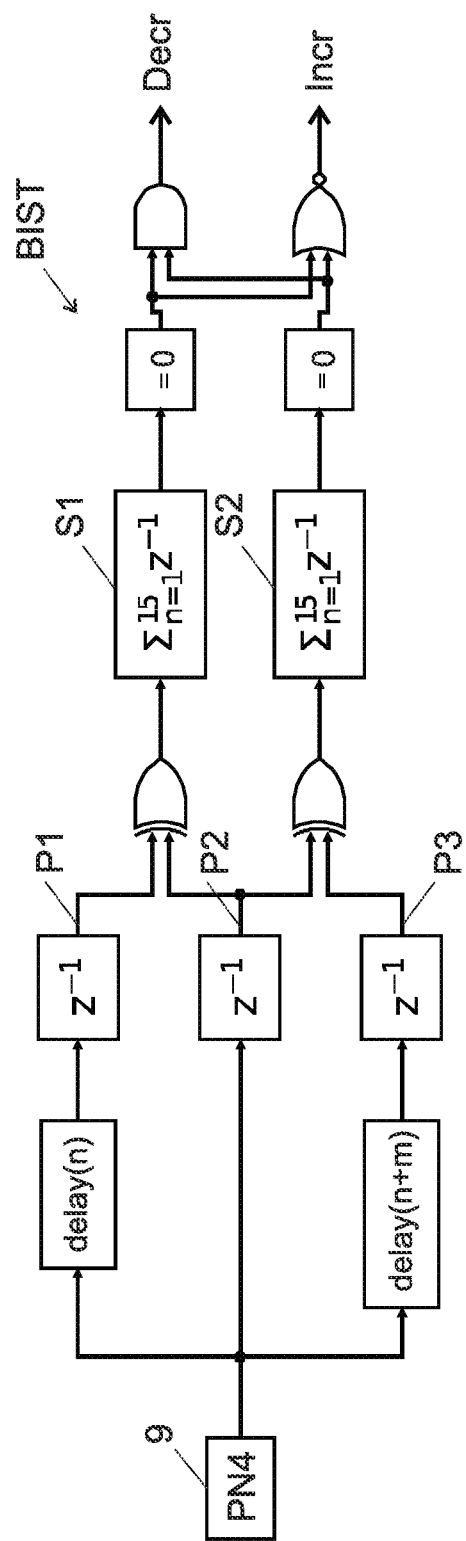
FIG. 4 shows a view of one embodiment of the built-in self test module of the first embodiment of the electronic device according to the invention.

The first loop can be a DLL (Delay Lock Loop) if the critical path replica module 4 comprises an open loop, as illustrated in FIG. 4. In this case, the speed measurement module allows to measure a time (the second delay $\tau_D$).

Figure 2:
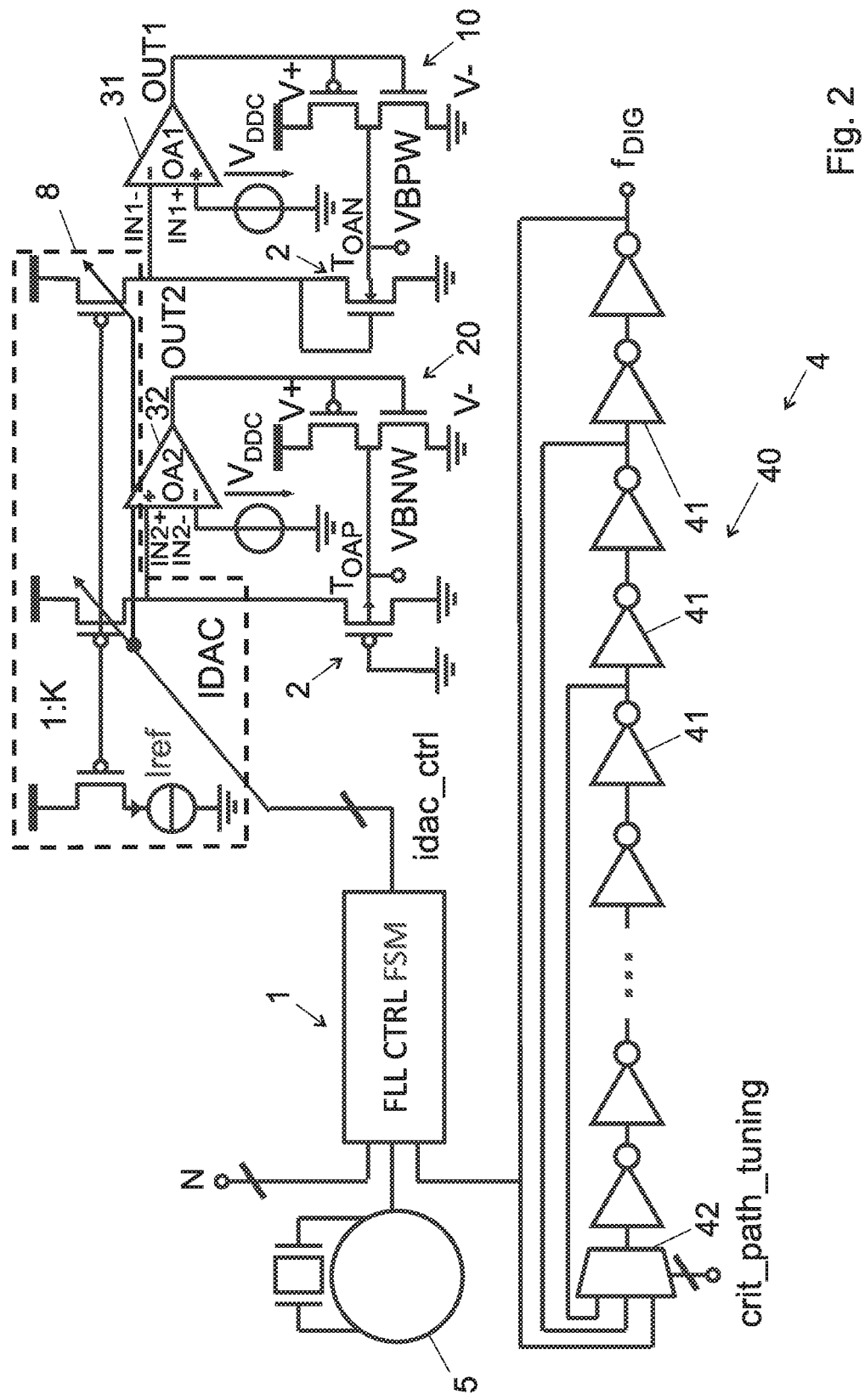
FIG. 2 shows a view of a first embodiment of the electronic device according to the invention.

The first loop can be a FLL (Frequency Lock Loop) or a PLL (Phase Lock Loop), if the critical path replica module 4 comprises a closed loop, e.g. a ring oscillator, as illustrated e.g. on FIG. 2. If the first loop is a FLL or a PLL, the speed measurement module 1 allows to measure a frequency (the operating frequency of the digital circuit 6) respectively a phase (related to the operating frequency).

In all the cases, the speed measurement module 1 allows to compare a speed of the critical path replica module 4, e.g. a time, a frequency or a phase, to a reference frequency $f_{REF}$, i.e. the frequency of the oscillator. For example, the speed measurement module 1 could comprise a counter arranged for counting the frequency $f_{REF}$ of the oscillator 5 during the second delay $\tau_D$ of the critical path replica module 4.

According to this comparison, if the relation $f_{DIG}=N*f_{REF}$ is not satisfied, the control module 3 according to the invention is configured to adjust the voltage at the first compensation terminal $V_{BPW}$ and at the second compensation terminal $V_{BNW}$, in order to modify the second delay $\tau_D$ of the critical path replica module 4 so as to operate the digital circuit 6 at the desired operating speed $f_{DIG}$.

In the embodiment of FIG. 1, the compensation device further comprises a current balance detector module 2. In one preferred embodiment, the current balance detector module 2 comprises a first replica transistor (not illustrated in FIG. 1) and a second replica transistor (not illustrated in FIG. 1) of opposite polarity of the first replica transistor.

Examples of said first replica transistors are illustrated in FIGS. 7A and 7B (references $T'''_N$, $T'''_P$). The first and second replica transistors are a replica of the corresponding first and second transistors of the digital circuit 6 to be compensated.

In the embodiment of FIG. 1, the current balance detector module 2 comprises a first replica terminal $V'''_{BPW}$ and a second replica terminal $V'''_{BNW}$ allowing to modify a threshold voltage of the first respectively second replica transistors $T'''_N$, $T'''_P$. In this embodiment, the first compensation terminal $V_{BPW}$ is arranged to be connected to the first replica terminal $V'''_{BPW}$. Therefore, the terminals $V_{BPW}$, $V'_{BPW}$, $V''_{BPW}$ and $V'''_{BPW}$ have substantially the same voltage.

In this embodiment, the second compensation terminal $V_{BNW}$ is arranged to be connected to the second replica terminal $V'''_{BNW}$. Therefore, the terminals $V_{BNW}$, $V'_{BNW}$, $V''_{BNW}$ and $V'''_{BNW}$ have substantially the same voltage.

In this embodiment, current balance detector module 2 is arranged for indicating a balance between a current flowing in the replica transistor and in the second replica transistor. The current balance detector module 2 is connected to the control module 3.

In particular, the control module is further arranged to adjust, on the basis of an output of the current balance detector module 2, the voltage at first compensation terminal $V_{BNW}$ and the voltage at the second compensation terminal $V_{BPW}$, in order to modify and/or guarantee the balance of the currents flowing in the first and second replica transistors, so as to equalise a rise time and a fall time of at least one logic gate comprising the first transistor and of the second transistor of the digital circuit 6. In this preferred embodiment, the compensation device allows not only to compensate PVT variations of the digital circuit 6 to be compensated, and to control the operating speed of the digital circuit 6 by using the critical path replica module 4 and the speed measurement module 1, but also to equalise a rise time and a fall time of at least one logic gate comprising the first transistor and of the second transistor of the digital circuit 6 by using the current balance detector module 2.

In other words, in this preferred embodiment, the compensation device implements also a second loop, allowing to control and/or equalise the rise and fall times of at least one logic gate comprising the transistors of the digital circuit 6.

For each of the first and second compensation terminals $V_{BPW}$ and $V_{BNW}$, the control module 3 of FIG. 1 comprises:
 a first and second drive modules 31 respectively 32, and
 a first and second compensation modules 10 respectively 20.

In the embodiment illustrated in FIG. 1, the first and second drive modules 31 respectively 32 are analog or digital modules connected to the output of the speed measurement module 1 and to the output of the current balance detector module 2. On the basis of at least one of those outputs, they allow to drive or configure the first and second compensation modules 10, 20, in order to change the voltage at the first compensation respectively second compensation terminals $V_{BPW}$, $V_{BNW}$.

In particular, in the embodiment illustrated in FIG. 1, the positive and negative power supplies V+1, V−1; V+2, V−2 of the first and second compensation modules 10, 20 cover the range of the desired substrate voltage excursion at the first and second compensation terminal $V_{BPW}$, $V_{BNW}$. In other words,
V−1<$V_{BPW}$<V+1, and
V−2<$V_{BNW}$<V+2.

In the illustrated embodiment, the first compensation module 10 comprises a first load $L_1$ in series with a first compensation transistor $T_N$, the first load $L_1$ being a first resistor $R_1$ or a first load compensation transistor $T_{PL}$ of opposite polarity of the first compensation transistor $T_N$. This alternative is indicated in FIG. 1 by the dotted line connecting the first load $L_1$ with the first load compensation transistor $T_{PL}$.

In the embodiment of FIG. 1, the first compensation transistor $T_N$ and the first load compensation transistor $T_{PL}$ are arranged to work as individually controlled current sink respectively current source generator, or as individually controlled switches, according to the output of the first drive module 31.

In this context, the expressions "current source generator" and "current sink generator" indicate generators of a current of opposite direction, one working as a source and the other as a sink.

In an similar way, in the embodiment of FIG. 1, the second compensation module 20 comprises a second load $L_2$ in series with the second compensation transistor $T_P$, the second load $L_2$ being a second resistor $R_2$ or a second load compensation transistor $T_{NL}$ of opposite polarity of the second compensation transistor $T_P$. This alternative is indicated in FIG. 1 by the dotted line connecting the second load $L_2$ with the second load compensation transistor $T_{NL}$.

In the embodiment of FIG. 1, the each compensation terminal $V_{BPW}$, $V_{BNW}$ is between the corresponding compensation transistor $T_N$, $T_P$ and its relative load $L_1$, $L_2$.

The second compensation transistor $T_P$ and the second load compensation transistor $T_{NL}$ are arranged to work as individually controlled current source respectively current sink, or as individually controlled switches.

However, the embodiment of FIG. 1 is not limitative, as the control module 3 could be implemented in other ways, as illustrated e.g. in the embodiment of FIG. 2.

FIG. 2 shows a view of a first embodiment of the electronic device 1000 according to the invention.

In the embodiment of FIG. 2, the critical path replica module 4 comprises a combination of cascaded digital logic gates, in particular a combination of cascaded inverters 41. In this particular embodiment, the critical path replica module 4 comprises a ring oscillator 40 comprising an odd number of cascaded inverters 41 with its input and output shorted.

The output of the ring oscillator 40 is used as a clock to drive the digital circuit 6. In other words, this clock defines I this case the operating frequency of the digital circuit 6.

In another embodiment (not illustrated), the critical path replica module 4 comprises more outputs, e.g. for deriving two non overlapping master/slave clocks, e.g. for latch based implementations.

In one embodiment, the length of the critical path replica module 4 (e.g. and in a non-limiting way, the ring oscillator 40 of FIG. 2) is tunable, preferably at the runtime of the electronic device 1000, in order to adjust the second temporal delay $\tau_D$ of the critical path replica module 4 for a given design of the digital circuit 6 to be compensated.

In other words, the average delay per stage of the critical path replica module 4 can be modified at any of the wanted operating speed $f_{DIG}$ so as to match the design-dependent critical path of different digital circuits 6.

In the embodiment of FIG. 2, the ring oscillator 40 comprises a multiplexer 42 at the input of the ring oscillator 40, this multiplexer comprising a critical path tuning terminal crit_path_tuning, allowing to tune the length of the ring oscillator 40, and hence the delay per stage $\tau_{D/N}$, the second delay $\tau_D$ being controlled by the control module 3.

In one preferred embodiment, the tunable length of the critical path replica module 4, e.g. of the ring oscillator 41, generates the operating speed $f_{DIG}$.

In the embodiment of FIG. 2, the oscillator 5 is a XO oscillator generating a reference frequency $f_{REF}$. In one preferred embodiment, this frequency is equal to 32 kHz.

In the embodiment of FIG. 2, the speed measurement module 1 comprises a frequency locked loop control finite state machine module FLL CTRL FSM, having as inputs:
  the predetermined frequency $f_{REF}$ of the ring oscillator 5,
  the operating speed $f_{DIG}$, and
  a ratio N, defining the desired ratio between the operating speed $f_{DIG}$ and the predetermined frequency $f_{REF}$. As discussed, N is a positive fractional or integer number, preferably superior to one, which can be defined by the user of the electronic device according to the type of application of the electronic device (e.g. memories, processors, etc.) and/or the value of the operating speed and/or according to other user's needs In the embodiment of FIG. 2, the operating speed $f_{DIG}$ is the desired digital frequency of the digital circuit 6.

In one embodiment, the frequency locked loop control finite state machine module FLL CTRL FSM has an output a signal idac_ctrl defining a current ratio K of the current mirror module 8 with regard to a reference current Iref.

Figure 3:
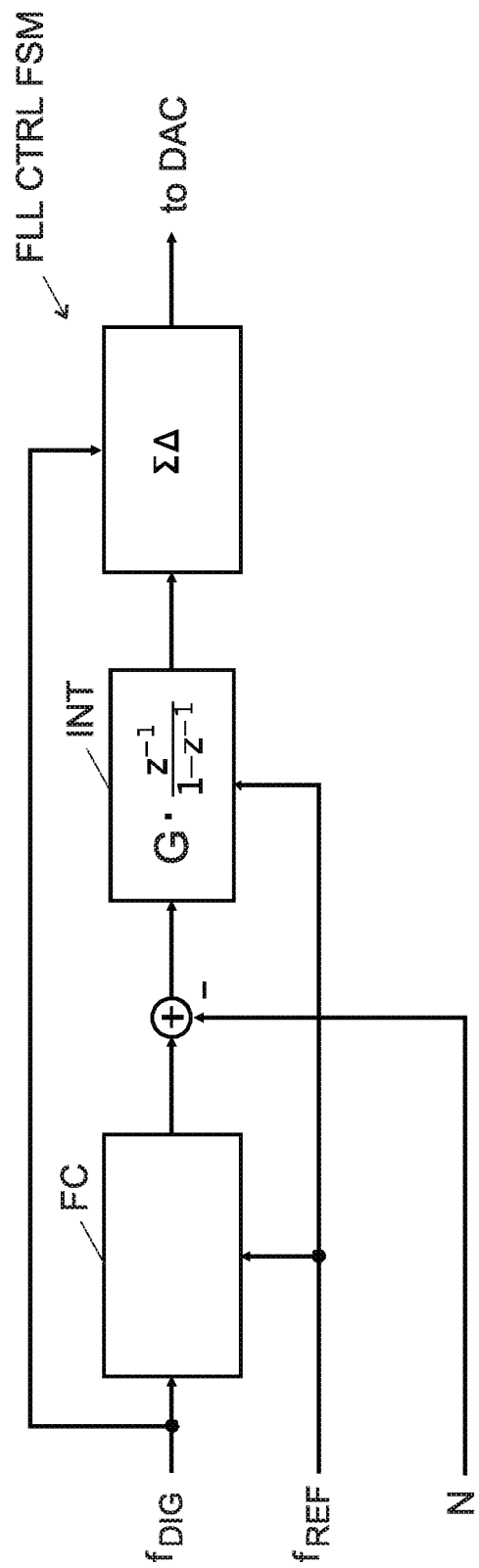
FIG. 3 shows a view of one embodiment of the frequency locked loop control finite state machine module of a first embodiment of the electronic device according to the invention.

In one embodiment, illustrated in FIG. 3, the frequency locked loop control finite state machine module FLL CTRL FSM comprises:
  a frequency counter module FC, followed by
  at least one integrator time constant module INT, followed by
  a sigma-delta modulator ΣΔ, allowing to increase the resolution of the output of the frequency locked loop control finite state machine module FLL CTRL FSM.

The sigma-delta modulator ΣΔ is connected to a digital analog converter (not illustrated) allowing to generate an analog gate voltage for the current mirror module 8.

In the embodiment of FIG. 2, the control module 3 comprises a first operational amplifier OA1 and a second operational amplifier OA2 configured to force the current of the current mirror 8 module to flow in the first and second operational amplifier transistors $T_{OAN}$, $T_{OAP}$, by adjusting the voltages at the first and second compensation terminals $V_{BPW}$, $V_{BNW}$.

In the embodiment of FIG. 2, the current balance detector module 2 comprises the current mirror module 8 and the first and operational amplifier transistors $T_{OAN}$, $T_{OAP}$. In particular, the first and operational amplifier transistors $T_{OAN}$, $T_{OAP}$ are the first respectively second replica transistors.

In the embodiment of FIG. 2, the matching of both the current sources by the current mirror module 8 guarantees the rise and fall time control at least one logic gate comprising the first and second transistors of the digital circuit 6.

In one embodiment, the first operational amplifier OA1 comprises a first inverting input terminal IN1−, a first non-inverting input terminal IN1+ and a first output terminal OUT1, wherein:
  the first non-inverting input terminal IN1+ is connected to is connected to a first supply source VDDC,
  the first inverting input terminal IN1− is connected to the current mirror module 8 and to the drain terminal of the first operational amplifier transistor $T_{OAN}$,
  the first output terminal OUT1 is connected to the first compensation terminal $V_{BPW}$ of the first operational amplifier transistor $T_{OAN}$ via a first compensation module 10.

In the embodiment of FIG. 2, the input of the first compensation module 10 is the first output terminal OUT1 and the output of the first compensation module 10 is arranged to be connected to the first compensation terminal $V_{BPW}$. The voltage of the output of the first compensation module 10, and then the voltage of the first compensation terminal $V_{BPW}$, has a value belonging to the range having as extremities V− and V+.

In the embodiment of FIG. 2, the second operational amplifier OA2 comprises an inverting input terminal IN2−, a non-inverting input terminal IN2+ and a second output terminal OUT2, wherein:
  the non-inverting input terminal IN2+ is connected to the current mirror module 8 and to the source terminal of the second operational amplifier transistor $T_{OAP}$,
  the inverting input terminal IN2− is connected to the first supply source VDDC,
  the second output terminal OUT2 is connected to the second compensation terminal $V_{BNW}$ of the second operational amplifier transistor $T_{OAP}$ via a second compensation module 20.

In the embodiment of FIG. 2, the input of the second compensation module 20 is the second output terminal OUT2 and the output of the second compensation module 20 is arranged to be connected to the second compensation terminal $V_{BNW}$. The voltage of the output of the second compensation module 20, and then the voltage of the second compensation terminal $V_{BNW}$, has a value belonging to the range having as extremities V− and V+.

In the embodiment of FIG. 2, the first operational amplifier OA1 corresponds to the first drive module 31 of FIG. 1 and the second operational amplifier OA2 corresponds to the second drive module 32 of FIG. 1.

A second supply source (the ground in the embodiment of FIG. 2) is connected to the drain terminal of the second operational amplifier transistor $T_{OAP}$ and to the source terminal of the first operational amplifier transistor $T_{OAN}$.

In the embodiment of FIG. 2, the first and second operational amplifier transistors $T_{OAN}$ and $T_{OAP}$ are connected in a diode configuration (i.e. the drain terminal is connected to the gate terminal).

The first and second operational amplifier transistors $T_{OAN}$ and $T_{OAP}$ are replica of the first respectively second transistor of the digital circuit 6 to be compensated.

In particular, if each of the operational amplifier transistor $T_{OAN}$ and $T_{OAP}$ is configured to be in saturation region, if the voltage at the source terminal of each of the operational amplifier transistors $T_{OAN}$ and $T_{OAP}$ has a predetermined value, and if the difference between the voltage at the gate terminal and the voltage at the source terminal of each of the operational amplifier transistors $T_{OAN}$ and $T_{OAP}$ has a predetermined value, the replica condition is satisfied, provided that the operational amplifier transistors $T_{OAN}$ and $T_{OAP}$ have the same technology and are matched with the first respectively second transistors of the digital circuit 6.

In the embodiment of FIG. 2, the compensation terminals $V_{BPW}$ and $V_{BNW}$ allow modify the threshold voltage of the first and second operational amplifier transistors $T_{OAN}$ and $T_{OAP}$.

In the embodiment of FIG. 2, the above-mentioned first loop allowing to control the speed of the digital circuit 6 to be compensated is intimately mixed with the second loop allowing to control and/or equalise the rise and fall times of at least one logic gate comprising the transistors of the digital circuit. In the embodiment of FIG. 2, the second loop is obtained by imposing the same current in first and second operational amplifier transistors $T_{OAN}$ and $T_{OAP}$ via the current mirror module 8. The control of this current via the first and second operational amplifiers OA1, OA2 acts and on the operating speedy $f_{DIG}$ (i.e. on the "differential mode") and on the balance of the currents of the first and second operational amplifier transistors $T_{OAN}$ and $T_{OAP}$ (i.e. on the "common mode").

In one embodiment, the electronic device f the invention comprises a built-in self test module BIST, illustrated in FIG. 4, for adjusting the length of the critical path replica module 4, e.g. of the ring oscillator 40 and/or for adjusting the second delay $\tau_D$ via the control module 3.

In one preferred embodiment, the built-in self test module BIST is in the digital circuit 6 to be compensated, e.g. in its critical path module. In another embodiment, the built-in self test module BIST is in the critical path replica module 4.

For example, if a multiplier is identified as the critical path module, the built-in self test module BIST is arranged to compute the result of the worst case multiplication and to compare it to a pre-calculated value stored in a memory: if the result of the multiplication matches the stored value, enough margin is provided and the length of the critical path replica module could be shortened, if they do not match, the length the length of the critical path replica module should be increased to increase the timing margin by reducing the average delay per logic gate of the critical path replica module 4.

In the embodiment of FIG. 4, the built-in self test module BIST comprises a pseudo-random digital sequence generator 9, connected to a first, second and third parallel paths P1, P2 respectively P3, the first and third paths P1, P3 being delayed with regards to the second path P2 by a first respectively third temporal delays (n respectively n+m), the third delay (n+m) being superior to the first delay (n).

In the embodiment of FIG. 4, the built-in self test module BIST further comprising logical operators (XOR, AND and OR in FIG. 5) for comparing the signals at the output of each of the three paths P1, P2, P3 so as to decide if the length of the critical path replica module 4 must be modified or not, on the basis of this comparing and/or if the second delay $\tau_D$ of the critical path replica module 4 must be modified or not via the control means 3.

The first delay (n) already include a temporal margin, i.e. a temporal difference between the second delay $\tau_D$ of the critical path replica module 4 and the first delay $\tau'_D$ of the critical path module of the electronic circuit 6 to be compensated.

In particular, the pseudo-random number generator 9 has $2^N-1$ states. In the embodiment of FIG. 4, N=4 so that it generates 15 codes with about 0 as many as 1 but whose sequence is pseudo-random. By comparing the direct signal in the second path P2 with the delayed signals in the first and third path P1, P3 by summing the 15 samples in the sum modules S1, S2 it is possible to check if there is a perfect correlation, i.e. if the delay related to the length of the critical path replica circuit is short enough for the digital circuit 6 to work.

If both outputs of the sum modules S1, S2 are equal to zero, the length of the critical path replica module 4 is increased so as to make the critical path of the digital circuit 6 faster, at a given operating speed $f_{DIG}$.

If both outputs of the sum modules S1, S2 are equal to one, the length of the critical path replica module 4 is decreased so as to make the critical path of the digital circuit 6 slower, at a given operating speed $f_{DIG}$.

If the outputs of the sum modules S1, S2 are different, the length of the critical path replica module 4 is not modified.

Figure 5:
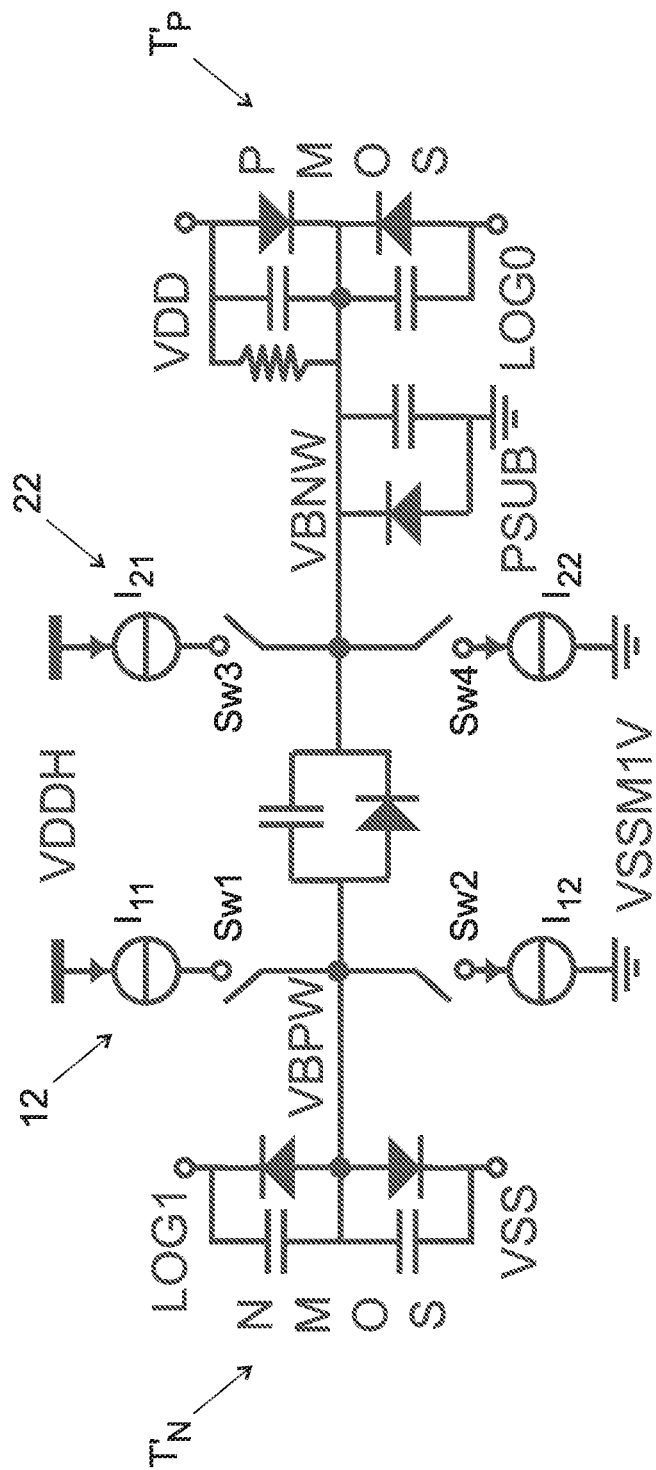
FIG. 5 shows a view a second embodiment of the control module of the compensation device according to the invention.

In another embodiment, illustrated in FIG. 5, the control module 3 comprises an H-bridge type charge pump module arranged to be supplied at voltages VDDH, VSSM1V corresponding at least to the extremes of range of the desired substrate voltage excursion or range at the first and second compensation terminals $V_{BPW}$, $V_{BNW}$. This H-bridge type charge pump module is similar to the one used to drive a differential loop filter in a PLL.

The control module 3 if the embodiment of FIG. 5 is alternative to the embodiment of the control module 3 of FIG. 2, comprising the operational amplifiers OA1, OA2.

The two branches of H-bridge type charge pump module of FIG. 5 correspond to the first respectively second compensation module 10, 20 of FIG. 1.

The first and second compensation terminals $V_{BPW}$, $V_{BNW}$ of FIG. 5 are directly connected to a model of the first respectively second transistors $T'_N$ and $T'_P$ of the digital circuit 6 to be compensated, in particular to the first terminal and a second terminal allowing $V_{BPW}$, $V_{BNW}$ to modify a threshold voltage at the first, second terminals $V'_{BPW}$, $V'_{BNW}$ of the first respectively second transistors $T'_N$ and $T'_P$.

In the embodiment of FIG. 5, the H-bridge type charge pump module comprises a first charge pump current module 12 and a second charge pump current module 14, each first and second charge pump current modules 12, 14 being connected to one of the two compensation terminals $V_{BPW}$, $V_{BNW}$, the H-bridge type charge pump module being arranged to modify the voltage at the first and second compensation terminals $V_{BPW}$, $V_{BNW}$ by modifying a current in each of the first and second charge pump current modules 12, 14.

In particular, in the embodiment of FIG. 5:
the first charge pump current module 12 comprises a first source current generator I11, in series with a first switch Sw1, a second switch Sw2, a first sink current generator I12; and
the second charge pump current module 22 comprises a second source current generator I21, in series with a third switch Sw3, a fourth switch Sw4, a second sink current generator I22.

In the embodiment of FIG. 5, the first compensation terminal $V_{BPW}$ is between the second switch Sw2 and the first switch Sw1, and the second compensation terminal $V_{BNW}$ is between the third switch Sw3 and the fourth switch Sw4.

The second and third switches Sw2, Sw3 and the first and fourth switches Sw1, Sw4 are controlled by the speed measurement module 1 and/or by the current balance detector module 2 via drive modules not illustrated.

In one embodiment, the second and third switches Sw2, Sw3 are closed by the drive modules at the same time, so as to control via the currents of the corresponding current generators I12, I21 the differential mode voltages at the first and second compensation terminals $V_{BPW}$ and $V_{BNW}$, in order to increase the second delay $\tau_D$ of the critical path replica module 4.

In another embodiment, the first and fourth switches Sw1, Sw4 are closed by the drive modules at the same time, so as to control via the currents of the corresponding current generators I11, I22 the differential mode voltages at the first and second compensation terminals $V_{BPW}$ and $V_{BNW}$, in order to reduce the second delay $\tau_D$ of the critical path replica module 4.

In one embodiment, the first switch Sw1 and the third switch Sw3, or the second switch Sw2 and the fourth switch Sw4 are closed at the same time, so as to control via the corresponding current generators I11, I21 respectively I12, I22 the common mode voltages at the first and second compensation terminals $V_{BPW}$ and $V_{BNW}$, in order to modify the ratio of the current flowing in a first replica transistor T'''$_N$ visible e.g. in FIG. 7A or 7B with the current flowing in the second replica transistor, T'''$_P$ visible e.g. in FIG. 7A or 7B, according to the output of the current balance detector module 2. This allows to modify the ratio of the currents flowing in the first and second transistors of the electronic circuit 6, whose the first and second replica transistors T'''$_N$ T'''$_P$ are a replica.

In one embodiment, the output of the current balance detector module 2 and the output of the speed measurement module 1 define four logic combinations, each combination allowing to activate via the first and second drive modules one of the switches of the first charge pump current module 12 and of the second charge pump current module 22.

It must be noted that the first charge pump current module 12 corresponds to the first compensation module 10 of FIG. 1, wherein the first compensation transistor $T_N$ is a MOS transistor working as a current source generator or as a switch and wherein the compensation load transistor $T_{PL}$ is a MOS transistor of opposite polarity working as current sink generator or as a switch. The same analogy applies to the second charge pump current module 22 of FIG. 5 and to the second compensation module 20 of FIG. 1. The supply voltages VDDH, VSSM1V of FIG. 5 correspond to an implementation of the voltages V+1(2) respectively V−1(2) of FIG. 1.

In an alternative (not illustrated) embodiment, the first source current generator, the second source current generator, the first sink current generator and/or the second sink current generator comprise an IDAC module controlled by a current locked loop control finite state machine module (not illustrated), in order to minimize a ripple on the voltage at the first and second compensation terminals $V_{BPW}$, $V_{BNW}$.

In one embodiment, this current locked loop control finite state machine module comprises an integrator arranged to dynamically trim a static average DC current needed at the first and second compensation terminal $V_{BPW}$, $V_{BNW}$.

Figure 6:
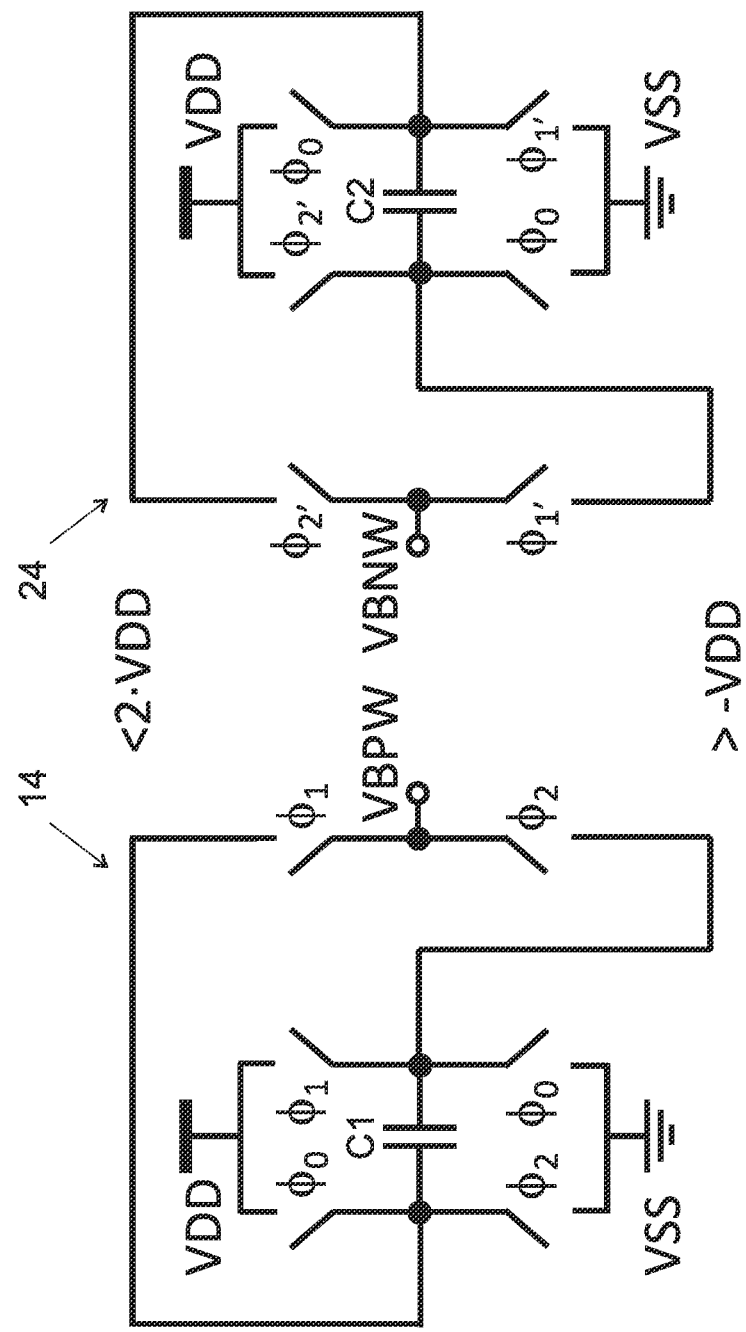
FIG. 6 shows a view of a third embodiment of the control module of the compensation device according to the invention.

In another embodiment, illustrated in FIG. 6 and alternative to the embodiment of FIG. 5, the control module 3 comprises a dual polarity DCDC-type charge pump converter module arranged to generate the desired substrate voltage excursion at the first and second compensation terminals $V_{BPW}$, $V_{BNW}$.

The dual polarity DCDC-type charge pump converter module is arranged to modify the voltage at the first and second compensation terminals $V_{BPW}$, $V_{BNW}$ by modifying a charge at those first and second compensation terminals $V_{BPW}$, $V_{BNW}$.

In the embodiment of FIG. 6, the dual polarity DCDC-type charge pump converter module comprises:

a first DCDC-type charge pump converter module 14, comprising a first charge pump flying capacitor C1, two voltage sources VDD and VSS (VSS being e.g. the ground), the first charge pump flying capacitor C1 being connected to the voltage sources VDD and VSS and to the first compensation terminal $V_{BPW}$, via couples of switches φn, wherein n=0, 1 or 2, which are commanded by the first drive module (not illustrated) in a predetermined sequence so as to generate the desired substrate voltage at the first compensation terminal $V_{BPW}$, the voltage varying in a range whose extremities depend on the two voltage sources VDD, VSS, and a second DCDC-type charge pump converter module 24, comprising a second charge pump flying capacitor C2, the two voltage sources VDD, VSS, the second charge pump flying capacitor being connected to the voltage sources VDD, VSS and to the second compensation terminal $V_{BNW}$, via couples of switches φn', wherein n=0, 1 or 2, which are commanded by the second drive module (not illustrated) in a predetermined sequence so as to generate the desired substrate voltage $V_{BNW}$ at the second compensation terminal, the voltage varying in a range whose extremities depend on the two voltage sources VDD, VSS.

The first charge pump current module 14 of FIG. 6 is an alternative implementation of the first compensation module 10 of FIG. 1. The same analogy applies to the second charge pump current module 24 of FIG. 6 and to the second compensation module 20 of FIG. 1. The supply voltages VDD, VSS of FIG. 6 correspond to an implementation of the voltages V+1(2) respectively V−1(2) of FIG. 1.

In the embodiment of FIG. 6, each of the first and second DCDC-type charge pump converter modules 14, 24 comprises a first couple of switches $\phi_0$, $\phi'_0$, arranged to be closed so as to charge the first respectively second charge pump flying capacitors C1, C2 at a voltage corresponding to a first difference between the two voltage sources VDD−VSS, and a second couples of switches $\phi_1$, $\phi'_1$ and/or a third couple of switches $\phi_2$, $\phi'_2$ arranged to be closed after the ri-opening of the first couples of switches $\phi_0$, $\phi'_0$, so as to alter the voltage at the respectively second charge pump flying capacitors C1, C2 in the range whose extremities depend on the two voltage sources VDD, VSS.

In the embodiment of FIG. 6, the extremities of this range are:

a second difference between the two voltage sources (VSS−VDD), and the double of the higher voltage source (2VDD).

Then the switches $\phi_1$ or $\phi_2$, ($\phi_{1'}$ or $\phi_{2'}$) are activated to alter the voltages of the corresponding compensation terminals $V_{BPW}$, $V_{BNW}$, towards more forward (FWD) or reverse (REV) modes respectively. In the forward mode, the operating speed $f_{DIG}$ is increased, in the reverse mode, it is reduced. The control is reversed for transistors of opposite polarity. The voltage at the first compensation terminal $V_{BPW}$ e.g. must be augmented to accelerate and vice-versa. The voltage at the second compensation terminal $V_{BNW}$ e.g. must be reduced to accelerate and vice-versa.

In one embodiment, not illustrated, more stages can be cascaded in the REV mode.

The embodiment of FIG. 6 is particularly advantageous when the digital circuit 6 to be compensated is supplied with a low power, e.g. with a photo voltaic cell wherein VDD—VSS is about 0.5 V.

FIGS. 7A and 7B illustrate two embodiments of the current balance detector module 2. Each of those embodiments can be used with the first and second charge pump current modules 12, 22 or with the first and second first charge pump current modules 14, 24.

Each of those embodiments can be used in combination with the replica path circuit module 4 of FIG. 8.

The current balance detector module 2 of FIG. 7A form a modified N-stages inverter-based comparator. The N-stages inverter-based comparator is "modified" as its first stage is similar to an inverter. Its push pull inputs are the $V_{BNW}$ and $V_{BPW}$ voltages. In particular, the first stage of the modified inverter-based comparator comprises replica transistors $T'''_N$ and $T'''_P$ of the digital circuit 6 to be compensated.

The number of the stages after the first stage of the modified inverter-based comparator is not too important and it could be even or odd. The stages after the first of the modified inverter-based comparator allows the modified inverter-based comparator to increase its gain.

At the output of the first stage of FIG. 7A, the voltage will be at about VDD/2. The output of the second stage will amplify this signal but not necessarily to reach the power supplies VDD or VSS (the ground in FIG. 7A). The output of the third stage or of the further stages will always be either '0' or '1' in order to be easily readable by the control circuit 3, not illustrated in FIG. 7A.

The switching point of the inverters of FIG. 7A will be at VDD/2 if the currents in the first and second replica transistors $T'''_N$, $T'''_P$ are equal. All the stages of the converter of FIG. 7A have the same voltages at the corresponding replica compensation terminals (not illustrated), which are connected to the first and second compensation terminals $V_{BPW}$, $V_{BNW}$.

In one preferred embodiment, the gate terminals of the inverter of the first stage are connected to a first supply voltage, to a node of a fixed voltage, or to a second supply voltage, according to the operating speed of the digital circuit 6 to be compensated and/or to a type of the application of the digital circuit 6, thereby allowing to control the balance of the I_ON currents (ON currents), the I_RET currents (currents in retention mode) respectively the I_LEAK currents (leakage currents) of the digital circuit 6 to be compensated.

For example, the comparator of FIG. 7A allows to make the balance of the currents of the first and second replica transistors $T'''_N$ and $T'''_P$ dependent of VGS=VDD, which is useful during the operation of the logic gates of the digital circuit 6 to be compensated.

The comparator of FIG. 7B allows to make the balance of the currents of the first and second replica transistors $T'''_N$ and $T'''_P$ dependent of VGS=VDD/2, which is useful during the retention of the logic gates of the digital circuit to be compensated, e.g. in SRAM applications.

Another comparator, not illustrated, allows to make the balance of the currents of the first and second replica transistors $T'''_N$ and $T'''_P$ dependent of VGS=0, which is useful for controlling the leakage current of the logic gates of the digital circuit to be compensated.

The three above-mentioned comparators could be combined in a single comparator, in which the voltage at the gate terminals of its first stage could be modified according to the applications and/or the user's needs.

In one embodiment, the electronic device according to the invention comprises several current balance detector modules 2 arranged to be used alternatively to scale their static consumption depending on the operating condition of the digital circuit 6 to be compensated.

In one embodiment, the number of the transistors of the first stage of the modified inverter-based comparator is superior to the number of transistor of the second stage, and the number of the transistors of the second stage is superior to the number of transistor of the third stage, in order to improve the precision of the current balance detector module.

In one embodiment, the current balance detector module (s) comprise(s) a number of digital gates superior to 50, e.g. superior to 100, used in series and/or parallel arrangement, so as to minimise their mismatch.

In one embodiment, the current balance detector module 2 of FIGS. 7A and/or 7B and the speed measurement module 1 of the critical path replica circuit of FIG. 8 are duty-cycled, e.g. by to maintain the digital circuit 6 in retention, e.g. by gating the operating speed $f_{DIG}$.

Figure 9:
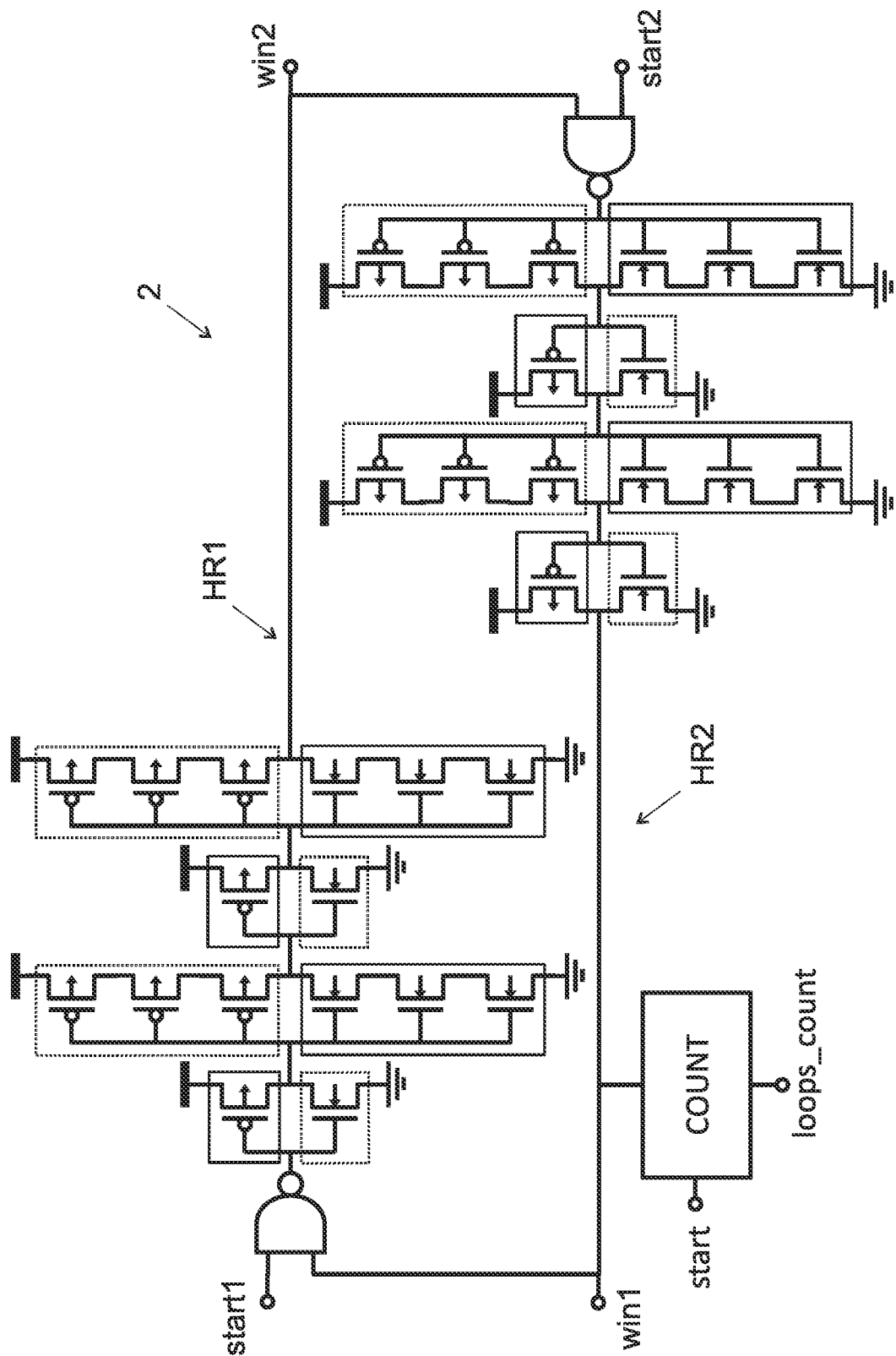
FIG. 9 shows a view another embodiment of the current balance detector module of the compensation device according to one embodiment of the invention.

In the embodiment of FIG. 9, the current balance detector module 2 is arranged to quantitatively indicate the ratio between the current flowing in the first replica transistor and the current flowing in the second replica transistor. In other words, in the embodiment of FIG. 9, the current balance detector module is a current balance measurement module.

The current balance measurement module of FIG. 9 comprises
two half rings HR1 HR2, each half ring comprising fast and slow NMOS transistors and fast and slow PMOS transistors,
each half ring comprising at a first end a first logic gate (a NAND logic gate in FIG. 9, but it could be another logic gate, e.g. a NOR logic gate) and at a second end a win terminal (win1 respectively win2), the first logic gate having a first input (start 1 respectively start 2) being the start input and a second input being the win terminal (win2 respectively win1) of the other half ring,
a first path for a first signal at the first input of the first logic gate, comprising fast transistors NMOS and slow transistors PMOS,
a second path for a second signal at the first input of the second logic gate (a NAND logic gate in FIG. 9, but it could be another logic gate, e.g. a NOR logic gate) comprising slow transistors NMOS and the fast transistors PMOS,
a counter module COUNT arranged to count the number of loops in the two half rings necessary for one of the first and second signals to catch the other, so as to indicate how balanced the NMOS and PMOS transistors are.

The NMOS and PMOS transistors of FIG. 7 are replica transistors of the first respectively second transistors of the digital circuit 6 to be compensated.

In other words, there are two start signals start1, start2, that start two "runner signals" that chase each other. One always takes the path comprising the transistors of the first and second half rings HR1, HR2 which are indicated with the letter R, the other always takes the path comprising the transistors of the first and second half rings HR1, HR2 which are indicated with the letter B.

As the slowest path determines the speed, the speed of the first runner signal taking the R path depends essentially on the NMOS transistors of the R path and the other on the PMOS transistors of the B path.

The counter module COUNT is arranged to count the number of loops in the two half rings necessary for one of the first and second signals to catch the other, so as to indicate how balanced the NMOS and PMOS transistors are. This allows to have a quantitative indication of the current ratio between the currents flowing in the transistors of the digital circuit 6.

In one embodiment, the current balance measurement module is arranged to provide proportional, integral or derivative coefficients easy to stabilize.

In one embodiment, which is common to all the embodiments of the all figures, the transistors of the electronic devices 6 are operated to work in a sub-threshold region or in a near-threshold region.

In one embodiment, which is common to all the embodiments of the all figures, the module of the difference between the voltage of first supply source and the voltage of second supply source of the digital circuit 6 is comprised between 50 mV and 900 mV, preferably being substantially equal to 500 mV.

According to one embodiment, which is common to all the embodiments of the all figures the transistors of the compensation device respectively of the digital circuit are realised in the technology silicon on insulator (SOI). According to another embodiment, the transistors of the compensation device respectively of the digital circuit are realised in the technology fully depleted silicon on insulator (FDSOI). According to another embodiment, the transistors of the compensation device respectively of the digital circuit are realised in the technology deeply depleted channel (DDC).

According to another (not illustrated embodiment), the digital circuit comprises a third and a fourth transistors of opposite polarity, the third and a fourth transistors being different from the first and second transistors, as e.g. they have a different orientation or as e.g. they are access transistors of a SRAM memory implemented by the digital circuit 6 or SRAM bit-cell transistors.

In this case, the electronic device 1000 comprises a second critical path replica circuit, a second speed measurement module and a second balance current detector module comprising transistors which are a replica of the third and fourth transistors of the digital circuit 6.

What is claimed is:

1. An electronic device comprising:
   a digital circuit to be compensated, arranged to be operated at an operating speed, and comprising a critical path module, said critical path module comprising a first transistor and a second transistor of opposite polarity of said first transistor, the digital circuit comprising a first terminal and a second terminal allowing to modify a threshold voltage of said first transistor and said second transistor, respectively, said critical path module being arranged to generate a first delay related to said operating speed,
   a compensation device for compensating PVT variations of said digital circuit and for controlling said operating speed, comprising:
   an oscillator, generating an oscillator signal having a predetermined frequency,
   a critical path replica module, arranged for generating a second delay equal or superior to a first delay of the critical path module of the digital circuit, and comprising a first critical path replica transistor, a second critical path replica transistor of opposite polarity of said first critical path replica transistor, a first critical path replica terminal and a second critical path replica terminal allowing to modify a threshold voltage of said first critical path replica transistor and said second critical path replica transistor, respectively,
   a speed measurement module, connected to the oscillator and to the critical path replica module, and arranged to determine a relation between the predetermined frequency of the oscillator and the second delay of the critical path replica module,
   a first compensation terminal,
   a second compensation terminal,
   wherein the first terminal is arranged to be connected to the first critical path replica terminal and to the first compensation terminal, the second terminal is arranged to be connected to the second critical path replica terminal and to the second compensation terminal, and the compensation device further comprises:
   a control module arranged to be connected to the speed measurement module, to the first compensation terminal and to the second compensation terminal, so as to adjust a voltage at the first compensation terminal and at the second compensation terminal, in order to modify the second delay of the critical path replica module so as to operate the digital circuit at the operating speed,
   the electronic device being characterized in that said critical path replica module is a replica of said critical path module of the digital circuit,
   wherein a tunable length of said critical path replica module generates said operating speed.

2. The electronic device of claim 1, wherein the compensation device further comprises:
   a current balance detector module, comprising a first replica transistor and a second replica transistor of opposite polarity of said first replica transistor, a first replica terminal and a second replica terminal allowing to modify a threshold voltage of said first replica transistor and said second replica transistor, respectively, current balance detector module being arranged for indicating a balance between a current flowing in a first replica transistor and in the second replica transistor, said current balance detector module being connected to the control module,
   the first compensation terminal being arranged to be connected to the first replica terminal,
   the second compensation terminal being arranged to be connected to the second replica terminal,
   the control module being further arranged to adjust, based on an output of said current balance detector module, the voltage at the first compensation terminal and the voltage at the second compensation terminal, in order to modify and/or guarantee the balance of the currents flowing in the first and second replica transistors, so as to equalise a rise time and a fall time of at least one logic gate comprising the first transistor and of the second transistor of the digital circuit.

3. The electronic device of claim 2, wherein the speed measurement module comprises a frequency locked loop control finite state machine module, having as inputs:
   the predetermined frequency of the ring oscillator,
   the operating speed generated by said critical path replica module, and
   a frequency ratio, defining a desired ratio between the operating speed and the predetermined frequency,
   wherein the current balance detector module comprises a current mirror module and wherein the frequency locked loop control finite state machine module has an output signal defining a current ratio of the current mirror module.

4. The electronic device of claim 2, wherein the control module comprises
   a first and second compensation modules, forming two parallel branches whose positive and negative power supplies cover a range of a desired substrate voltage excursion at the first and second compensation terminal a first and second drive modules connected to an output of the speed measurement module and to the output of the current balance detector module, based on at least one of said outputs, configured to drive the first and second compensation modules, in order to change the voltage at the first compensation terminal and the second compensation terminal, respectively.

5. The electronic device of claim 4, wherein the control module comprises an H-bridge type charge pump module arranged to be supplied at voltages corresponding at least to extremes of a range of a desired substrate voltage excursion at a first and second compensation terminal, wherein said H-bridge type charge pump module comprises a first charge pump current module and a second charge pump current module, each first and second charge pump current modules being connected to one of the first compensation terminal or the second compensation terminal, said H-bridge type charge pump module being arranged to modify the voltage at the first and second compensation terminals by modifying a current in each of said first and second charge pump current modules,
wherein the output of the current balance detector module and the output of the speed measurement module define four logic combinations, each combination allowing to activate one of the switches of the first charge pump current module and of the second charge pump current module.

6. The electronic device of claim 2, wherein the control module comprises:
a first second compensation modules, forming two parallel branches whose positive and negative power supplies cover a range of a desired substrate voltage excursion at the first and second compensation terminal
a first and second drive modules connected to an output of the speed measurement module and to the output of the current balance detector module, based on at least one of said outputs, configured to drive the first and second compensation modules, in order to change the voltage at the first compensation terminal and the second compensation terminal, respectively,
wherein the current balance detector module comprises an N-stages modified inverter-based comparator, wherein two gate terminals of the inverter of a first stage are connected to a first supply voltage, to a node of a fixed voltage, or to a second supply voltage, according to the operating speed of the digital circuit to be compensated and/or to a type of an application of said digital circuit.

7. The electronic device of claim 2, wherein the control module comprises
a first second compensation modules, forming two parallel branches whose positive and negative power supplies cover a range of a desired substrate voltage excursion at the first and second compensation terminal
a first and second drive modules connected to an output of the speed measurement module and to the output of the current balance detector module, based on at least one of said outputs, configured to drive the first and second compensation modules, in order to change the voltage at the first compensation terminal and the second compensation terminal, respectively,
wherein the current balance detector module is arranged to quantitatively indicate a ratio between the current flowing in the first replica transistor and the current flowing in the second replica transistor.

8. The electronic device of claim 2, wherein the control module comprises
a first second compensation modules, forming two parallel branches whose positive and negative power supplies cover a range of a desired substrate voltage excursion at the first and second compensation terminal
a first and second drive modules connected to an output of the speed measurement module and to the output of the current balance detector module, based on at least one of said outputs, configured to drive the first and second compensation modules, in order to change the voltage at the first compensation terminal and the second compensation terminal, respectively,
wherein the current balance detector module is arranged to quantitatively indicate a ratio between the current flowing in the first replica transistor and the current flowing in the second replica transistor,
wherein the current balance detector module comprises a balance measurement module, said balance measurement module comprising:
two half rings, each half ring comprising fast and slow NMOS transistors and fast and slow PMOS transistors,
each half ring comprising at a first end a first logic gate and at a second end a win terminal, the first logic gate having a first input being a start input and a second input being the win terminal of the other half ring,
a first path for a first signal at the first input of the first logic gate comprising fast transistors NMOS and slow transistors PMOS,
a second path for a second signal at a first input of a second logic gate comprising slow transistors NMOS and fast transistors PMOS,
a counter module arranged to count a number of loops in the two half rings necessary for one of the first and second signals to chase the other, so as to indicate how balanced the NMOS and PMOS transistors are.

9. The electronic device of claim 1, wherein said critical path replica module comprises a combination of cascaded digital logic gates, each of said cascaded digital logic gates comprising said first critical path replica transistor and/or said second critical path replica transistor.

10. The electronic device of claim 1, wherein a length of said critical path replica module is tuned at a runtime of the electronic device, in order to adjust said second delay for a given design of said digital circuit to be compensated, wherein the critical path replica module comprises a ring oscillator, wherein said ring oscillator comprises a multiplexer at an input of the ring oscillator, said multiplexer comprising a critical path tuning terminal, allowing to tune a length of said ring oscillator, and hence a delay per stage of said ring oscillator, the second delay being controlled by said control module.

11. The electronic device of claim 1, wherein a length of said critical path replica module is tuned at a runtime of the electronic device, in order to adjust said second delay for a given design of said digital circuit to be compensated, comprising a built-in self test module for adjusting the length of said critical path replica module and/or for adjusting the second delay via the control module.

12. The electronic device of claim 1, wherein the speed measurement module comprises a frequency locked loop control finite state machine module, having as inputs:
the predetermined frequency of the ring oscillator,
the operating speed generated by said critical path replica module, and
a frequency ratio, defining a desired ratio between the operating speed and the predetermined frequency.

13. The electronic device of claim 1, wherein the control module comprises an H-bridge type charge pump module arranged to be supplied at voltages corresponding at least to extremes of a range of a desired substrate voltage excursion at a first and second compensation terminal.

14. The electronic device of claim 1, wherein the control module comprises an H-bridge type charge pump module arranged to be supplied at voltages corresponding at least to extremes of a range of a desired substrate voltage excursion at a first and second compensation terminal, wherein said H-bridge type charge pump module comprises a first charge pump current module and a second charge pump current module, each first and second charge pump current modules being connected to one of the first compensation terminal or the second compensation terminal, said H-bridge type charge pump module being arranged to modify the voltage at the first and second compensation terminals by modifying a current in each of said first and second charge pump current modules.

15. The electronic device of claim 1, wherein the control module comprises a dual polarity DCDC-type charge pump converter module arranged to generate a desired substrate voltage excursion at a first and second compensation terminals.

16. The electronic device of claim 1, wherein the control module comprises a dual polarity DCDC-type charge pump converter module arranged to generate a desired substrate voltage excursion at a first and second compensation terminals, wherein dual polarity DCDC-type charge pump converter module is arranged to modify the voltage at the first and second compensation terminals by modifying a charge at said first and second compensation terminals.

17. The electronic device of claim 1, the digital circuit comprising a third and a fourth transistors of opposite polarity, the third and a fourth transistors being different from the first and second transistor.

18. The electronic device of claim 1, the digital circuit comprising a third and a fourth transistors of opposite polarity, the third and a fourth transistors being different from the first and second transistors, the electronic device comprising a second critical path replica circuit, a second speed measurement module and a second balance current detector module comprising transistors which are a replica of the third and fourth transistors of the digital circuit.

19. An electronic device comprising:
a digital circuit to be compensated, arranged to be operated at an operating speed, and comprising a critical path module, said critical path module comprising a first transistor and a second transistor of opposite polarity of said first transistor, the digital circuit comprising a first terminal and a second terminal allowing to modify a threshold voltage of said first transistor and said second transistor, respectively, said critical path module being arranged to generate a first delay related to said operating speed,
a compensation device for compensating PVT variations of said digital circuit and for controlling said operating speed, comprising:
an oscillator, generating an oscillator signal having a predetermined frequency,
a critical path replica module, arranged for generating a second delay equal or superior to a first delay of the critical path module of the digital circuit, and comprising a first critical path replica transistor, a second critical path replica transistor of opposite polarity of said first critical path replica transistor, a first critical path replica terminal and a second critical path replica terminal allowing to modify a threshold voltage of said first critical path replica transistor and said second critical path replica transistor, respectively,
a speed measurement module, connected to the oscillator and to the critical path replica module, and arranged to determine a relation between the predetermined frequency of the oscillator and the second delay of the critical path replica module,
a first compensation terminal,
a second compensation terminal,
wherein the first terminal is arranged to be connected to the first critical path replica terminal and to the first compensation terminal, the second terminal is arranged to be connected to the second critical path replica terminal and to the second compensation terminal, and the compensation device further comprises:
a control module arranged to be connected to the speed measurement module, to the first compensation terminal and to the second compensation terminal, so as to adjust a voltage at the first compensation terminal and at the second compensation terminal, in order to modify the second delay of the critical path replica module so as to operate the digital circuit at the operating speed,
the electronic device being characterized in that said critical path replica module is a replica of said critical path module of the digital circuit,
wherein a length of said critical path replica module is tuned at a runtime of the electronic device, in order to adjust said second delay for a given design of said digital circuit to be compensated.

* * * * *